(12) United States Patent
Gravrand et al.

(10) Patent No.: US 8,759,873 B2
(45) Date of Patent: Jun. 24, 2014

(54) BISPECTRAL MULTILAYER PHOTODIODE DETECTOR AND METHOD FOR MANUFACTURING SUCH A DETECTOR

(75) Inventors: Olivier Gravrand, Fontanil Cornillon (FR); Jacques Baylet, Grenoble (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 249 days.

(21) Appl. No.: 13/231,262

(22) Filed: Sep. 13, 2011

(65) Prior Publication Data

US 2012/0068225 A1 Mar. 22, 2012

(30) Foreign Application Priority Data

Sep. 16, 2010 (FR) ...................................... 10 57390

(51) Int. Cl.
- *H01L 31/0328* (2006.01)
- *H01L 31/0336* (2006.01)
- *H01L 31/072* (2012.01)
- *H01L 31/109* (2006.01)

(52) U.S. Cl.
USPC .... 257/184; 257/290; 257/440; 257/E31.032; 438/48

(58) Field of Classification Search
USPC ........................... 257/184, 290, 440, E31.032
See application file for complete search history.

(56) References Cited

U.S. PATENT DOCUMENTS

| | | | |
|---|---|---|---|
| 6,034,407 A | 3/2000 | Tennant et al. | |
| 6,525,387 B2 | 2/2003 | Bauer et al. | |
| 7,352,043 B2 | 4/2008 | Gidon | |
| 7,936,034 B2 | 5/2011 | Rothman | |
| 8,441,089 B2 * | 5/2013 | Gravrand et al. | 257/440 |

FOREIGN PATENT DOCUMENTS

| | | |
|---|---|---|
| FR | 2 812 454 A1 | 2/2002 |
| FR | 2 849 273 A1 | 6/2004 |
| WO | 2005/101512 A2 | 10/2005 |

OTHER PUBLICATIONS

G. Destefanis, et al., "*Status of HgCdTe Bicolor and Dual-Band Infrared Focal Arrays at LETI*," Journal of Electronic Materials, vol. 36, No. 8, 2007, pp. 1031-1044.

Dong-Su Kim, et al., "*A Three Wavelength Infrared Focal Plane Array Detector Element*," IEEE Photonics Technology Letters, vol. 6, No. 2, Feb. 1994, pp. 235-238.

G.L. Destefanis, "*Electrical Doping of HgCdTe by Ion Implantation and Heat Treatment*," Journal of Crystal Growth, vol. 86, 1988, pp. 700-722.

* cited by examiner

*Primary Examiner* — Thien F Tran
(74) *Attorney, Agent, or Firm* — Burr & Brown, PLLC

(57) ABSTRACT

A bispectral detector comprising upper and lower semiconductor layers of a first conductivity type in order to absorb a first and a second electromagnetic spectrum, separated by an intermediate layer that forms a barrier; semiconductor zones of a second conductivity type implanted in upper layer and lower layer and each implanted at least partially in the bottom of an opening that passes through upper layer and intermediate layer; and conductor elements connected to semiconductor zones. At least that part of each opening that passes through upper layer is separated from the latter by a semiconductor cap layer: whereof the concentration of dopants of the second conductivity type is greater than $10^{17}$ cm$^{-3}$; and whereof the thickness is chosen as a function of said concentration so that it exceeds the minority carrier diffusion length in the cap layer.

14 Claims, 6 Drawing Sheets

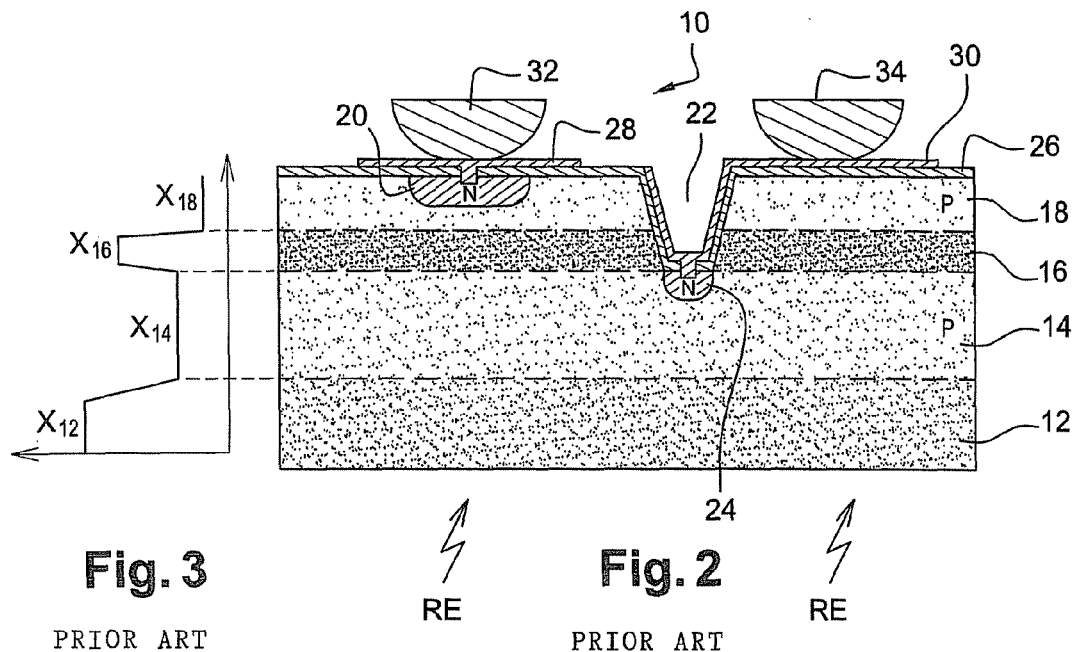
Fig. 3 PRIOR ART
Fig. 2 PRIOR ART
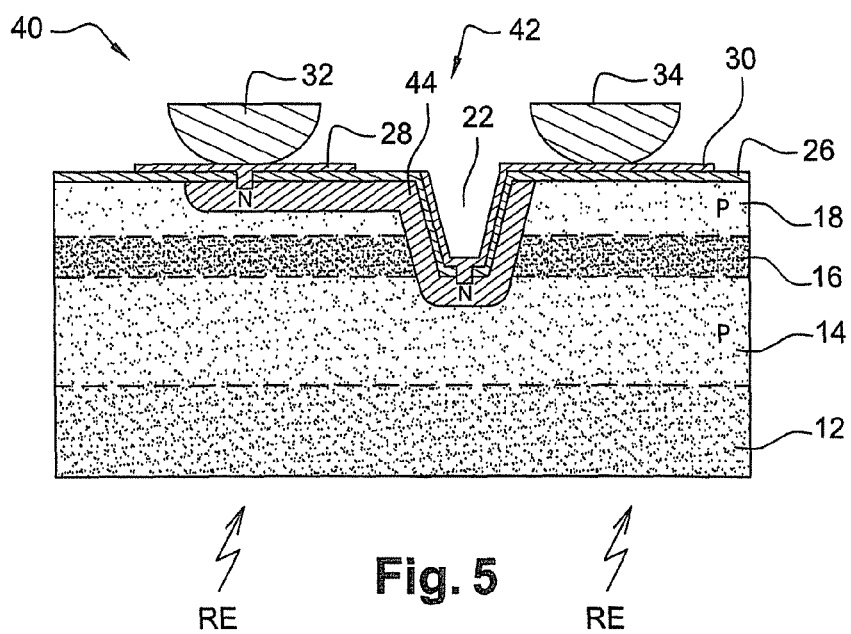
Fig. 5

BISPECTRAL MULTILAYER PHOTODIODE DETECTOR AND METHOD FOR MANUFACTURING SUCH A DETECTOR

BACKGROUND OF THE INVENTION

1. Field of the Invention

The invention relates to the field of bispectral detection using two absorption layers in a single stack in which PN junctions are formed.

2. Description of Related Art

A bispectral detector that is preferred because of its high fill factor and temporal coherence comprises a stack of several semiconductor layers for absorbing different electromagnetic radiation frequency ranges, the layers being insulated from each other and wherein PN junctions are formed in order to collect the charge carriers created by the absorption of incident radiation. Such a detector is described, for instance, in Document U.S. Pat. No. 6,034,407 and the document entitled "*Status of HgCdTe bicolor and dual-band infrared array at LETI*" by de Destefanis, Journal of Electronic Materials 36(8), p. 1031, (2007). These first two references relate to the material CdHgTe. An example of a similar structure using a different material can be consulted in the following document: Kim, "*A Three Wavelength Infrared Focal Plane Array Detector Element*", IEEE Photonics Tech Lett 6(2) p 235 (1994).

In order to better understand the problems encountered with this type of detector, an example of a bispectral array detector 10 is described below, making reference to FIGS. 1 to 3. FIG. 1 is a top view of this detector, represented here in the form of a two-dimensional two-pixel by three-pixel detector, FIG. 2 is a cross-sectional view along line A-A in FIG. 1, and FIG. 3 is a profile showing the cadmium composition x of various alloys of cadmium, mercury and tellurium ($Cd_xHg_{1-x}Te$) that form the stack of the detector.

Detector 10 comprises a stack formed by:
- a substrate 12 consisting of an alloy of cadmium, zinc and tellurium or "CZT" alloy;
- a P-type semiconductor lower absorption layer 14 formed on substrate 12. Layer 14 consists of a $Cd_xHg_{1-x}Te$ alloy P-doped due to mercury vacancies and a low energy gap. The $x_{14}$ cadmium composition of layer 14 is selected so that the layer has absorbing properties in a first wavelength range around a wavelength $\lambda_{14}$;
- an intermediate layer 16 forming a barrier produced on lower layer 14. Layer 16 consists of a material having a high energy gap, for example a $Cd_xHg_{1-x}Te$ alloy whereof the $x_{16}$ composition is high in relation to cadmium compositions $x_{14}$, $x_{18}$ of layers 14 and 18; and
- an upper P-type semiconductor absorption layer 18 formed on layer 16 that forms a barrier. Layer 18 consists of a $Cd_xHg_{1-x}Te$ alloy P-doped due to mercury vacancies and a low energy gap. The $x_{18}$ cadmium composition of layer 18 is selected so that the layer has absorbing properties in a second wavelength range around a wavelength $\lambda_{18}$ such as $\lambda_{18} < \lambda_{14}$.

Type N semiconductor zones 20 are also produced in upper layer 18, for example by boron ion implantation. This ion implantation step has the effect of converting the P-type intrinsic doping to N-type doping and thus forms an array of PN junctions and hence photodiodes.

Openings 22 are also machined through upper layer 18 and intermediate layer 16 as far as lower layer 14 in order to obtain access to the latter. N-type semiconductor zones 24 are made in lower layer 14 by applying N-doping by boron ion implantation, for example, to those parts of lower layer 14 that just touch the bottom of openings 22. An array of PN junctions, and hence photodiodes, is thus formed in lower layer 14.

Semiconductor zones 20 and semiconductor zones 24 preferably form detection arrays of L rows by C columns respectively where L and C equal 2 and 3 respectively in the example shown and the array of zones 24 is offset relative to the array of zones 20 so as to obtain a zone 24 in the centre of a rectangle or a square consisting of four zones 24.

A passivation layer 26 (not shown in FIG. 1 for the sake of clarity) produced with the aid of a CdTe/ZnS bilayer is also deposited on the exposed face of upper layer 18 and in openings 22.

Finally, a metallic contact pad 28 is formed on upper layer 18 above each zone 20 and penetrates into zone 20 in order to collect the charges contained therein. Similarly, a metallic contact pad 30 is deposited in each opening 22 in the form of a layer that covers the flanks of the opening and penetrates into corresponding zone 24 in order to collect the charges contained in that zone. Contact pad 30 extends on the upper face of passivation layer 26 in order to facilitate connection of pad 30 to external interfacing (not shown). Finally, an indium bump 32, 34 is used on that part of each contact pad 28, 30 formed on the upper face of passivation layer 26 in order to hybridize the stack on a readout circuit (not shown) by using flip chip technology.

Detector 10 described above is a backside illuminated sensor. The exposed face of substrate 12 receives electromagnetic radiation RE which penetrates the stack. The portion of radiation RE contained in the first wavelength range is absorbed by lower layer 14, and the portion of radiation RE contained in the second wavelength range is absorbed by upper layer 18.

As is known in itself, the absorption of photons in lower layer 14 and upper layer 18 releases charge carriers that diffuse into semiconductor zones 20, 24 and are collected via contact pads 28, 30. A bias voltage is or is not applied between a common peripheral contact (not shown in FIG. 2) and contact pads 28, 30 in a manner that is known in itself.

The role of intermediate layer 16 is to prevent the charge carriers created in one of layers 14, 18 from diffusing into the other layer 14, 18, thereby producing a phenomenon known as crosstalk which is detrimental to detection quality. This function is more commonly referred to as a "barrier".

The quality of the barrier function of intermediate layer 16 depends mainly on the difference between the band gap value of intermediate layer 16 on the one hand and that of lower layer 14, and that of upper layer 18 on the other hand. Intermediate layer 16 forms a potential barrier that separates the valence and conduction bands of lower layer 14 and upper layer 18, thus limiting the movement of charge carriers from one layer to another.

In a $Cd_xHg_{1-x}Te$ type semiconductor alloy, the energy gap value is chiefly determined by the mercury composition (1−x) or, equivalently, by the cadmium composition x. FIG. 3 illustrates a typical profile for the cadmium compositions x of the various layers of the stack with intermediate layer 16 having an $x_{16}$ composition that is preferably at least 50% higher than each of the $x_{14}$, $x_{18}$ compositions of lower layer 14 and upper layer 18.

Openings 22 are necessary in order to access lower layer 14, thus making it possible to produce semiconductor zones 24 and produce contact pads 30 to collect the charges in zones 24.

However, regardless of the machining technology used to form openings 22, the walls of the openings always have many imperfections. The crystal quality of the flanks of the hole may be degraded by etching with this resulting in a high surface recombination rate. In fact, those parts of openings 22 that are present in upper layer 18 are recombination sources for charge carriers in that layer as well as sources of low-frequency noise associated with this generation current for the PN junctions of this layer 18.

One solution that is often adopted in order to mitigate this problem is to move the PN junctions of upper layer 18 away from openings 22. This therefore reduces the pixel fill factor.

Another solution involves using plasma machining techniques to produce openings 22 and then repairing the flanks of the openings by annealing. This solution would be the ideal preference but requires perfect mastery of the etching process which entails onerous technological development work.

SUMMARY OF THE INVENTION

The object of the invention is to solve the problem posed by imperfections in the openings by proposing a detector and a method for manufacturing that detector wherein those parts of the openings contained in the upper layer are made electrically invisible to that layer even though these imperfections may still be present.

To achieve this, the object of the invention is a bispectral detector for detecting a first and a second electromagnetic radiation range, comprising:
a stack of upper and lower semiconductor layers of a first conductivity type in order to absorb a first and a second electromagnetic radiation range respectively and which are separated by an intermediate layer that forms a potential barrier between the upper and lower layers;
semiconductor zones of a second conductivity type opposite to the first conductivity type and implanted in the upper and lower layers, each semiconductor zone in the lower layer being implanted at least partially in the bottom of an opening that passes through the upper and intermediate layers; and
electrical conductor elements connected respectively to the semiconductor zones in order to collect the electrical charges in these zones.

According to the invention, at least that part of each opening that passes through the upper layer is separated from the latter by a semiconductor cap layer of the second conductivity type:
whereof the concentration of dopants of the second conductivity type is greater than $10^{17}$ cm$^{-3}$; and
whereof the thickness is chosen as a function of said concentration so that it exceeds the minority carrier diffusion length in the cap layer.

In fact, the carriers generated by said surface move into the material around them by diffusion before recombining. The diffusion length is then defined by the average distance travelled by a minority carrier during its lifetime. This diffusion length diminishes rapidly with doping (classically, a fraction of a micrometre is obtained with $10^{17}$ cm$^{-3}$ doping).

In other words, the higher the concentration of dopants of the second conductivity type, for instance N, implanted in a material of the first conductivity type, for instance P, the shorter the diffusion length of the charge carriers in said N-doped material is.

Also, by choosing an appropriate thickness for the cap layer—a thickness of around three times the charge carrier diffusion length for example—said charge carriers are therefore no longer able to reach the flanks of the openings and therefore recombine on the imperfections in these flanks. Conversely, the charge carriers generated by the flanks cannot then diffuse as far as the junction and contribute towards the photodiode's dark current and noise.

Thus, a passivation layer made of alloy $Cd_xHg_{1-x}Te$ which is initially of type P thanks to mercury vacancies and which is then converted to N-type doping with a concentration in excess of $10^{17}$, by boron ion implantation for example, and which also has a thickness greater than 500 nm effectively masks the openings. This thickness can be around 100 nm if the N-dopant concentration is equal to or greater than $10^{18}$.

The openings are therefore electrically masked in respect of charge carriers in the upper layer. Sources of charge carrier recombination and noise created by the openings are thus significantly attenuated or even eliminated entirely.

In one embodiment of the invention:
every semiconductor zone in the upper layer forms a continuous volume with an adjacent semiconductor zone of the lower layer; and
the intermediate layer is made of a material that is insulating with respect to the materials of the upper and lower layers or is made of a semiconductor material of the first conductivity type, whereof the band gap is more than three times that of each of the lower and upper layers.

In other words, producing semiconductor zones in this way achieves an optimal photodiode fill factor because it is possible to position the PN junctions of the upper layer closer to the openings. In addition, choosing an intermediate layer limits any crosstalk.

Preferably:
the upper and lower layers are made of an alloy of cadmium, mercury and tellurium that is P-doped by mercury vacancies;
and the intermediate layer is made of an alloy of cadmium and tellurium or an alloy of cadmium, zinc and tellurium.

In other words, the intermediate layer fulfils a virtually perfect barrier function because it ensures insulation of the upper and lower layers.

Alternatively:
the upper and lower layers are made of an alloy of cadmium, mercury and tellurium that is P-doped by mercury vacancies;
and the intermediate layer is made of an alloy of cadmium, mercury and tellurium having a mercury composition that is less than half of the mercury composition of each of the upper and lower layers.

In other words, the intermediate layer has a minimal mercury composition so as to facilitate building the stack. The stack is grown on the substrate by molecular beam epitaxy for example. At the same time, the intermediate layer fulfils an extremely high quality barrier function thanks to the high value of its band gap caused by its low mercury composition.

In fact, in the case of CdHgTe, an interface between two different compositions creates a potential barrier in the valence band which thus blocks the minority carriers of the P-type material.

In one embodiment, that part of each opening that passes through the intermediate layer is separated from the latter by a semiconductor cap layer of the second conductivity type.

In one embodiment, the intermediate layer is made of a material that is insulating with respect to the material of the upper and lower layers or is made of a semiconductor material of the first conductivity type, whereof the band gap is more than three times that of each of the lower and upper layers.

The object of the invention is also a method for manufacturing a bispectral detector for detecting a first and a second electromagnetic radiation range, involving:
forming a stack of upper and lower semiconductor layers of a first conductivity type in order to absorb a first and a second electromagnetic radiation range respectively and which are separated by an intermediate layer that forms a potential barrier between the upper and lower layers;

producing at least one opening through the upper and intermediate layers and extending as far as the lower layer;

producing a first and a second set of semiconductor zones of a second conductivity type opposite to the first conductivity type and implanted in the upper and lower layers respectively, one semiconductor zone being implanted at least partially in the bottom of every opening; and producing electrical conductor elements connected respectively to the semiconductor zones in order to collect the electrical charges in these zones.

According to the invention, doping of the second conductivity type by ion implantation or ion beam milling is performed on the flanks of every opening on at least that part of said flanks that is located in the upper layer.

For more details, the reader should refer to the paper by de G. Destefanis entitled "*Electrical doping of HgCdTe by ion implantation and heat treatment*", Journal of Crystal Growth 86 p 700 (1988).

In other words, it has been observed that these doping techniques form, on the surface of the elements to which they are applied, a layer with a high N-dopant concentration or a layer referred to as "N+"; this concentration is greater than $10^{17}$ cm$^{-3}$ and extends over a thickness that is sufficient to electrically mask the openings.

Thus, applying these doping techniques to a P-type $Cd_xHg_{1-x}Te$ material creates, because of its mercury vacancies, an approximately 100 nm thick N+ layer with an N-dopant concentration of around $10^{18}$ cm$^{-3}$ which is easily sufficient to effectively mask the openings.

In one embodiment of the invention, the intermediate layer is made of a material that is insulating with respect to the materials of the upper and lower layers, a semiconductor material of the first conductivity type having a band gap that is selected so that it is at least three times greater than that of each of the lower and upper layers;

and doping of the second conductivity type is applied to all the openings so that, in the bottom of the openings, semiconductor zones of a second conductivity type are formed in the lower layer.

In other words, the cap layer according to the invention is made using the technique used to form the semiconductor zones of the second conductivity type. In fact, ion implantation and ion beam milling naturally form a stack of an N+ layer having a high dopant concentration and an N-type layer having a lower dopant concentration. It should also be noted that a cap layer which electrically masks the openings can be produced conjointly with the semiconductor zones of a second conductivity type in the lower layers and therefore produced in a single process step. For instance, a single ion implantation step is performed using appropriate masking of the stack.

Alternatively, doping of the second conductivity type on the flanks of the openings is performed by ion beam milling only for that portion of the flanks of the openings contained in the upper layer without extending into the barrier layer if the latter is devoid of mercury.

In one variant of the invention, doping of the second conductivity type on the flanks of the openings extends onto the exposed face of the upper layer so that semiconductor zones of the second conductivity type are formed in the latter.

The fill factor of the photodiodes is therefore optimal. Moreover, the semiconductor zones in the upper layer, as well as the layers to electrically mask the openings, are produced in a single step, for instance by applying appropriate masking during ion implantation.

In another variant of the invention, the semiconductor zones of the second conductivity type in the upper layer are produced so that they are not in contact with the semiconductor zones of the second conductivity type obtained after doping the flanks of the openings. In particular, semiconductor elements of the second conductivity type are also framed in the upper layer, especially by ion implantation or ion beam milling and these elements connect the semiconductor zones of the second conductivity type obtained after doping the flanks of the openings to a common conductor element.

In other words, this avoids pinch-off in the semiconductor zones of the second conductivity type in the upper layer due to the presence of the openings. This limits the dark current. In addition, forming semiconductor elements makes it possible to bring all the semiconductor zones of the openings to the same potential.

In one embodiment of the invention, the upper and lower layers are made of an alloy of cadmium, mercury and tellurium that is P-doped by mercury vacancies;

and the intermediate layer is made of an alloy of cadmium and tellurium or an alloy of cadmium, zinc and tellurium.

In another embodiment, the upper and lower layers are made of an alloy of cadmium, mercury and tellurium that is P-doped by mercury vacancies;

and the intermediate layer is made of an alloy of cadmium, mercury and tellurium having a mercury composition that is less than half of the mercury composition of each of the upper and lower layers.

BRIEF DESCRIPTION OF THE DRAWINGS

The invention will be made more readily understandable by reading the following description which is given merely by way of example and relates to the accompanying drawings in which identical references denote identical or analogous components and in which:

FIGS. 1 and 2 are top and cross-sectional views of an array detector such as that described above in the preamble;

FIG. 3 is a profile of the cadmium composition of the layers of the stack of the detector shown in FIGS. 1 and 2, as described above in the preamble;

FIGS. 4 and 5 are top and cross-sectional views of an array detector according to a first embodiment of the invention;

DETAILED DESCRIPTION OF THE INVENTION

First Embodiment

Figure 1:
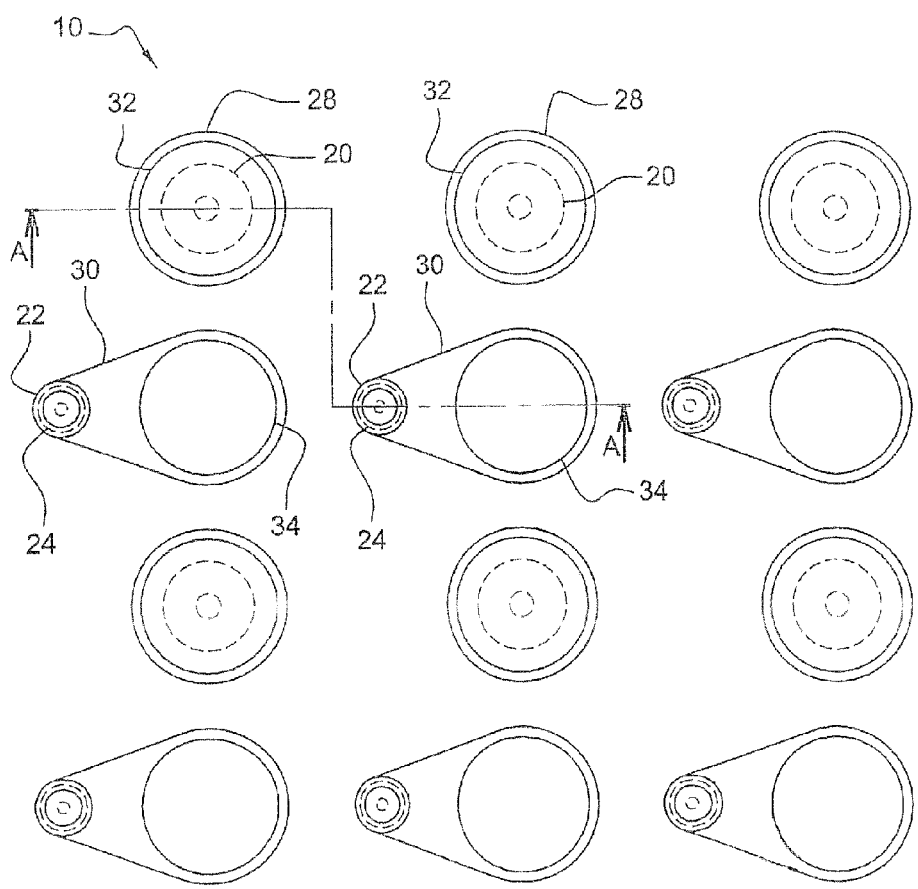

A detector 40 according to a first embodiment of the invention is described below making reference to FIGS. 3 and 6. Detector 40 differs from detector 10 in FIGS. 1 to 3 by virtue of the shape of the N-type semiconductor zones, or "N-type zones", implanted in layers 14, 16 and 18 of the stack.

More especially, after depositing passivation layer 26, N-type doping is performed by boron ion implantation for example, on portions of the upper face 42 of the stack through passivation layer 26.

This ion implantation is preferably performed using an appropriate mask placed on the upper face 42 and masking the latter, except for those portions that are to be implanted. Layers 12, 14, 16, openings 22, contact pads 28, 30 and interfacing 32, 34 are produced in accordance with the method described in the document entitled "*Status of HgCdTe bicolor and dual-band infrared array at LETI*" by Destefanis, JEM 36(8), p. 1031, 2007.

Figure 4:
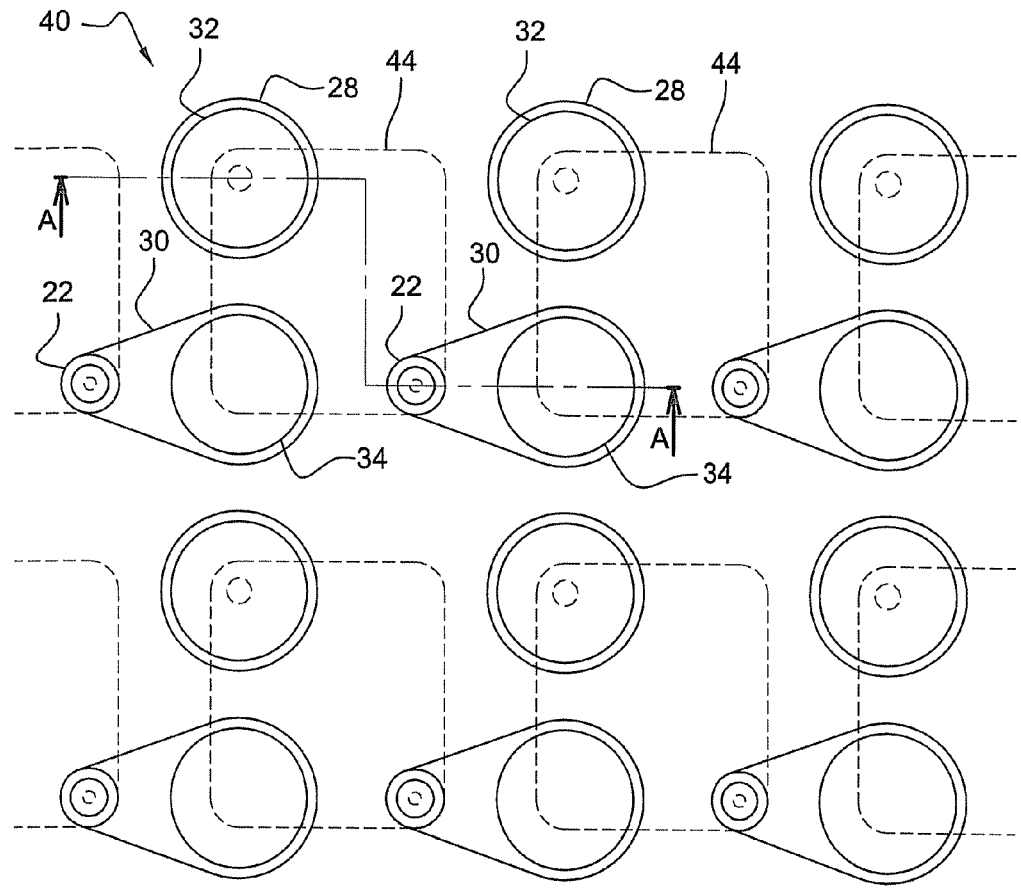

Each of the implanted portions comprises an opening 22 and extends over part of upper layer 18 on top of which metallic contact pad 28 is formed, as shown in FIG. 4. Spatially contiguous volumes 44 of N-type zones are obtained in this way. Each of these volumes 44 therefore encompasses one opening 22 and constitutes both an N-type zone for forming a PN junction in upper layer 18 and an N-type zone implanted in the bottom of opening 22 in order to form a PN junction in lower layer 14.

Figure 6:
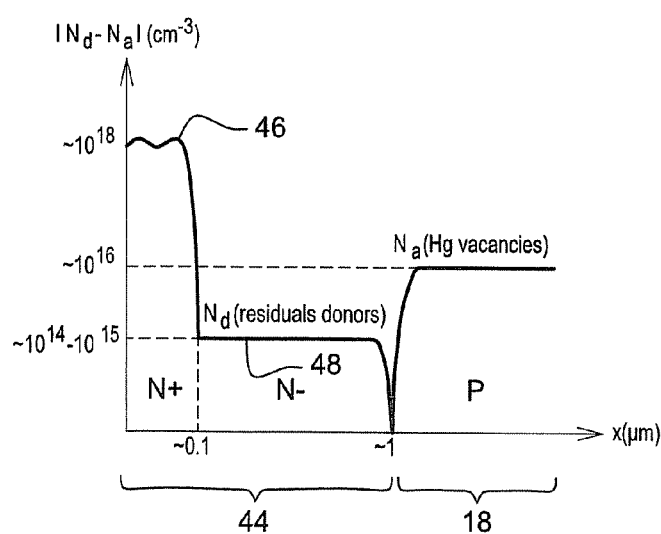
FIG. 6 is a profile showing the concentration of charge donors in the stack after ion implantation.

FIG. 6 shows the spatial donor concentration profile thus obtained by ion implantation. This profile is taken along any axis that is perpendicular to the wall of an opening 22 contained in upper layer 18 and includes the charge donor concentration in a volume 44 as well as the charge donor concentration in upper layer 18. Here, the concentrations are plotted as a function of the thickness along the axis in question.

Here, it can be noted that one volume 44 essentially divides up into a first "N+" layer 46 having a thickness of around 100 nm and an N-dopant concentration roughly equal to $10^{18}$ and a second "N−" layer 48 having a thickness of several hundred nm, 900 nm for instance, and a lower N-dopant concentration. It is demonstrated that layer 46 is sufficient to electrically mask the walls of openings 22 from charge carriers contained in upper layer 18.

Such a profile is substantially found throughout volume 44, with only the "P" part varying as a function of upper layer 18, lower layer 14 or intermediate layer 16. The layer denoted "N−" in the profile forms a PN junction with the adjacent zone denoted "P" of the upper or lower layer.

It is also worth noting that the fill factor of the photodiodes created by implanting N-type semiconductor zones in the upper and lower P-type layers is optimal. In fact, there is no need whatsoever to allow a minimum clearance between the PN junctions of the upper layer and openings 22 because the latter are electrically masked.

Also note that the N-type zones can pass through intermediate layer 16 because of ion implantation which is performed all over the flanks of openings 22. If one is not careful: the N-type zones thus constituted may allow charge carriers to move between upper layer 18 and lower layer 14 through intermediate layer 16. This may result in crosstalk.

In order to mitigate this, intermediate layer 16 is advantageously chosen so that the ion implantation performed on the flanks of openings 22 does not create any N-type zones in intermediate layer 16.

Thus, if the upper and lower layers are made of a P-type $Cd_xHg_{1-x}Te$ alloy through doping by mercury vacancies, intermediate layer 16 consists of an alloy of cadmium and tellurium or an alloy of cadmium, zinc and tellurium. Not only is such an alloy insulating with respect to P-type $Cd_xHg_{1-x}Te$ alloys and fulfils a high-quality barrier function, also, ion implantation does not create any N-type zone in intermediate layer 16 because doping reversal takes place exclusively due to the presence of mercury in the alloy. As there is no continuity between the N-type zones in the upper and lower layers, the charge carriers therefore cannot move between these layers via the intermediate layer. This therefore prevents crosstalk.

However, such alloys make the stack fabrication method more complicated. In fact, the technique used to form upper layer 18 depends on the nature of the substrate on which it is produced and hence, in this case, intermediate layer 16. For example, the above-mentioned alloys are not the most appropriate for encouraging growth of upper layer 16 by using Molecular Beam Epitaxy (MBE) which is usually the preferred technique for producing layers made of a $Cd_xHg_{1-x}Te$ alloy.

In order to encourage the growth of upper layer 18 on intermediate layer 16, it is thus preferable to add a minimal quantity of mercury, thereby producing this layer made of a CdHgTe alloy. However, the effect of the presence of mercury in intermediate layer 16 is that subsequent ion implantation on the flanks of openings 22 forms N-type zones in layer 16, hence allowing possible movement of charge carriers between upper layer 18 and lower layer 16.

The mercury composition of layer 16 is restricted in order to prevent crosstalk from occurring. More especially, the cadmium composition of this layer exceeds twice the cadmium composition of each of the upper layer 18 and lower layer 14. This way, when there is limited differential bias between the N-type zones of the upper layer and the N-type zones of the lower layer, there is electrical insulation of sufficient quality between these layers, due to the formation of a potential barrier on the bands of the semiconductor on crossing the boundary between a small band gap (layers 18 and 14) and a large band gap (layer 16) even when N+ layers are present in intermediate layer 16 and, therefore, all the more so, if N− layers are present. If necessary, it is possible to shift the composition of barrier layer 16 towards larger band gaps in order to enhance its insulating properties.

Moreover, it is also possible to vary the thickness of intermediate layer 16 in order to limit the voltage gradient in the latter, with the thickness being chosen depending on the differential bias applied between the N-type zones of the upper and lower layers when the detector is in use. This provides sufficient insulation between the upper and lower layers.

By way of example:
lower layer 14 is 5 μm thick and has a cadmium composition $x_{14}$ of 0.3. Layer 14 is thus adjusted for a wavelength of 5.5 μm at a temperature of 77 K and has an energy gap $E_g$=0.24 eV;
upper layer 18 is 3 μm thick and has a cadmium composition $x_{18}$ of 0.22. Layer 18 is thus adjusted for a wavelength of 11 μm at a temperature of 77 K and has an energy gap Eg=0.1 eV; and
intermediate layer 16 is 1 μm thick and has a cadmium composition $x_{16}$ of 0.8. Layer 16 thus has an energy gap Eg=1.1 eV.

Second Embodiment

As stated earlier, the first embodiment makes it possible to optimise the fill factor of the photodiodes created by ion implantation. However, degraded performance may be observed because the N-type zones in upper layer 18 comprise vertical parts formed in the flanks of openings 22. There may be pinch-off regions in the PN junctions of upper layer 18, especially at locations where zone 44 forms a bend. Pinch-off in a PN junction has the effect of increasing the leakage currents in the latter, especially due to the tunnel effect.

Figure 7:
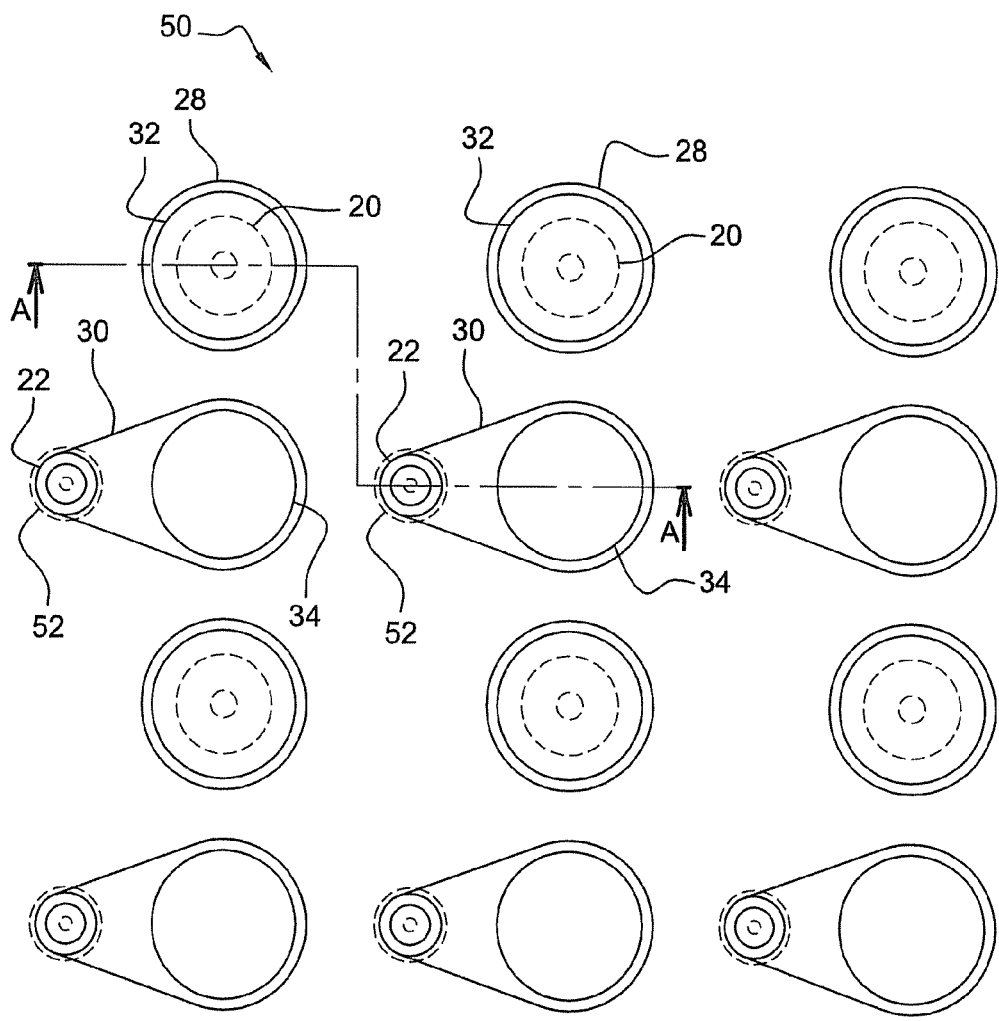
FIGS. 7 and 8 are top and cross-sectional views of an array detector according to a second embodiment of the invention.
Figure 8:
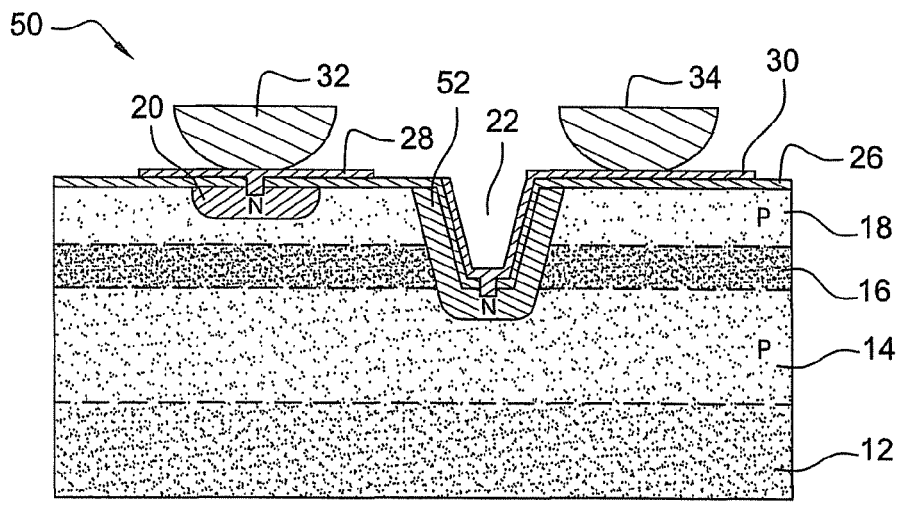

In order to mitigate this problem, a detector 50 according to a second embodiment, shown in FIGS. 7 and 8 differs from the first embodiment in that N-type zones 20 of the upper layer, under contact pads 28, are distinct from the N-type zones 52 formed on the flanks of openings 22, as shown in FIGS. 7 and 8. N-type zones 20 of the PN junctions in upper layer 18 therefore do not contain any pinch-off region.

The method for fabricating detector 50 thus differs from the method for fabricating detector 40 according to the first embodiment in terms of the geometry of the mask that is used during ion implantation, with this mask also masking a portion of upper layer 18 around every opening 22.

Third Embodiment

In the second embodiment, the potential of the N-type zones faulted on the flanks of openings 22 and contained in upper layer 18 is free to float because they are not connected to any fixed potential. The zones are electrically insulated from the zones in lower layer 14 because of the barrier function fulfilled by intermediate layer 16, as explained above in relation to the choice of materials used for the intermediate layer in the first embodiment, and are also not connected to the N-type zones of the PN junctions in upper layer 18 (which are brought to a potential for charge collection purposes).

If no bias is applied to the N-type zone on the flank of openings 22, the PN junction will naturally assume its open-circuit potential. However, because this potential floats, the space-charge zone of this PN junction is likely to fluctuate over time due to the effect of fluctuations in various parameters (e.g. fluctuation of the recombination current associated with the surfaces of openings 22). Consequently, these fluctuations in the N-type zones are also likely to modify the current collected by the adjacent diodes. Such interference can potentially generate noise in adjacent PN junctions, chiefly those in upper layer 18.

In order to mitigate this problem, a detector 60 according to a third embodiment comprises N-type semiconductor elements 62 produced, by ion implantation for example, in upper layer 18 conjointly with the production of N-type zones 20 in the latter and N-type zones 52 on the flanks of openings 22.

Figure 9:
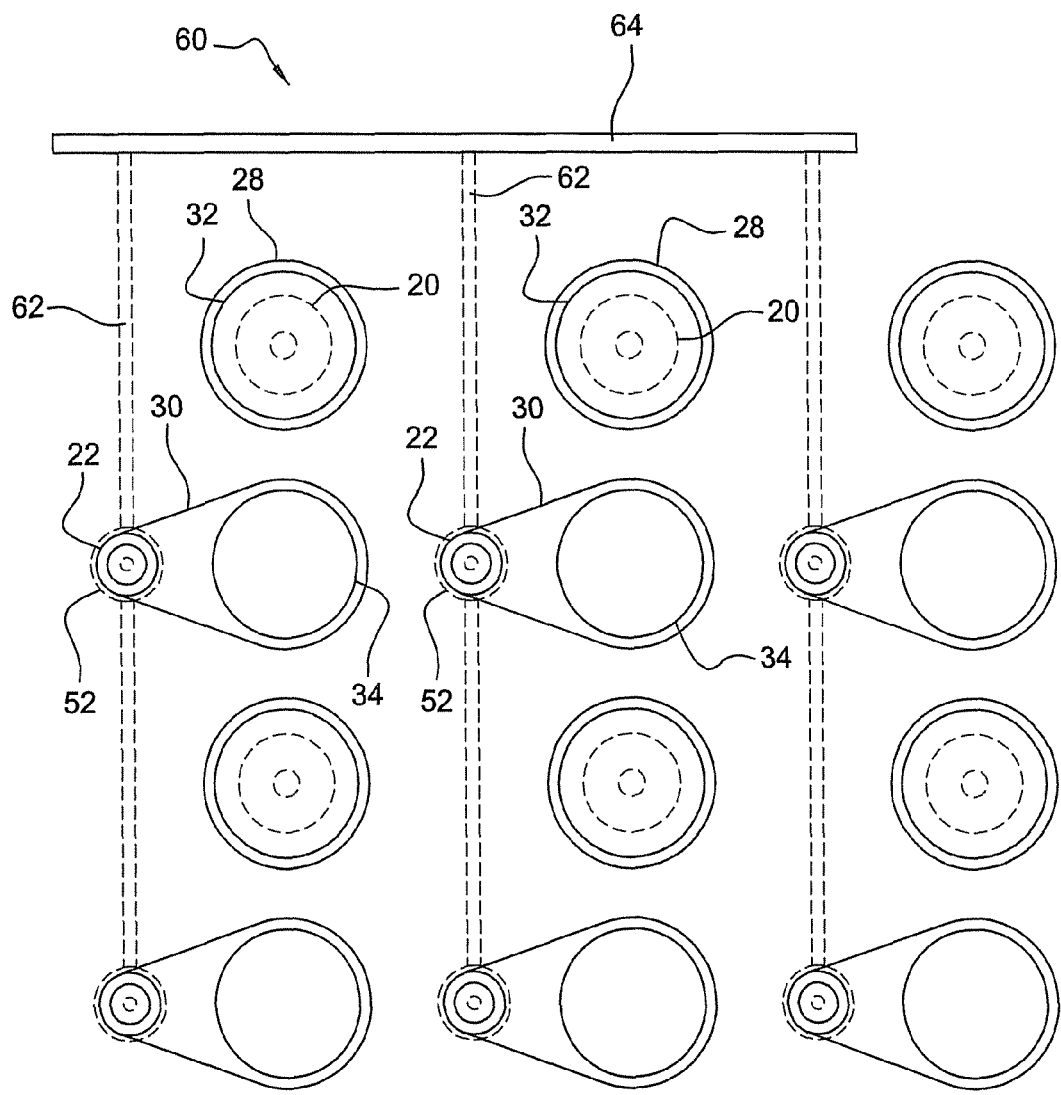
FIG. 9 is a top view of an array detector according to a third embodiment of the invention.

The function of these elements 62 is to set the potential of those portions of N-type zones 52 contained in upper layer 18 to the same value. For example and as shown in FIG. 9, elements 62 interconnect consecutive N-type zones 52 in the same column of the array of opening 22, with zones 52 at the end of a column also being connected to a metallic element 64 which is preferably brought to the same potential as that of contact pads 32, and hence that of the PN junctions of lower layer 14.

Once again, the method for fabricating detector 60 differs from that for fabricating detectors 40 and 50 in the first and second embodiment in terms of the geometry of the masks used during ion implantation.

Embodiments in which ion implantation is used to obtain N+ zones surrounding the opening parts contained in upper layer 18 have been described. Ion implantation has the advantage of being a well mastered technology, especially as far as ageing of the diodes thus formed is concerned.

Nevertheless, ion implantation only makes it possible to precisely monitor the geometry of the implanted zone in a plane that is perpendicular to the direction in which implantation is applied. In fact, if ion implantation is applied at right angles to the stack, N-type zones may appear in intermediate layer 16 because of the angle that exists between the flank of the openings and the direction in which ion implantation is applied. Thus, as stated earlier, precautions must be taken with regard to crosstalk which can occur if the N-type zones pass through intermediate layer 16 and this makes it mandatory to choose materials for this layer very carefully.

It is possible not to apply ion implantation to those portions of the openings that are contained in intermediate layer 16, but this entails applying multiple rotations to the stack during fabrication in order to apply ion implantation at right angles to the flanks of openings 22. This is very expensive both in terms of fabrication time and the equipment required.

Fourth Embodiment

Ion beam milling is used in order to mitigate this problem. This technique makes it possible to obtain the same result as ion implantation, namely conductivity reversal by doping, while forming N-type zones consisting of N+ layers and N− layers.

Ion beam milling involves more fabrication steps than simple ion implantation without rotation. In fact, in order to conveniently dope the flanks of openings 22, it is necessary to work with a non-zero ion flux angle of incidence (typically 30°) accompanied by continuous rotation of the sample during implantation. Using this process, doping is reversed over a sufficient material thickness to obtain the sought-after passivation function.

In contrast, if a CdHgTe material is ion-beam etched, doping reversal takes place to a depth of around 1 μm below the etched surface without it being necessary to employ a specific angle of incidence, thereby simplifying the process.

For example, openings 22 are conventionally etched, then the portion of the openings contained in upper layer 18 is overetched by ion beam milling, this has the effect of creating N-type zones in this portion only and therefore an N+ layer that surrounds every opening 22. In addition, ion beam milling also has the advantage of producing conductivity reversal over a larger thickness than ion implantation and hence produces a thicker N+ layer.

Figure 10:
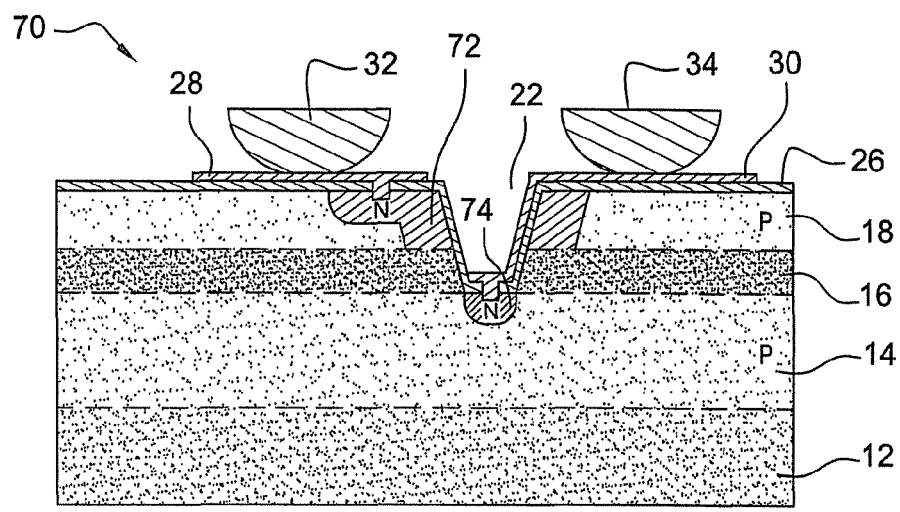
FIG. 10 is a cross-sectional view of an array detector according to a fourth embodiment of the invention.

N-type zones 72, 74 of the PN junctions of upper layer 18 and lower layer 14 are, for example, as illustrated in FIG. 10, also produced by ion beam milling with the N-type zones of the PN junctions of upper layer 18 advantageously, but not necessarily, forming volumes 72 that are contiguous with the N-type zones of openings 22 in order to obtain an optimal fill factor.

Because there are no N-type zones that pass through intermediate layer 16, it is possible to relax the constraints that are placed on the choice of materials from which intermediate layer can be made.

By way of numerical examples:
- the openings are separated by a distance of 20 μm;
- the openings are cylindrical and have a diameter of 8 μm;
- at least one N-type zone having a diameter of 10 μm is formed around every opening;
- N-type zones measuring 4 μm are formed in the bottom of the openings; and
- N-type zones having a diameter of 4 μm to 6 μm are formed on the upper layer.

One application of the invention which uses a $Cd_xHg_{1-x}Te$ alloy has been described.

Obviously, the invention can also be applied to other types of materials with the same result, namely forming an N+ layer having an N-type dopant concentration and thickness that are sufficient to electrically mask the openings.

For example, materials with a small energy gap based on salts of lead (PbSnTe for example) offer the same flexibility for designing heterostructures as material CdHgTe. The bispectral structures described here could also be produced by antimony ion implantation or by using cadmium diffusion to form an N-type zone around a hole between two layers of P-doped PbSnTe having different compositions separated by a $SiO_2$ layer acting as a barrier.

Similarly, the invention is also applicable to the formation of P+ layers in N-type materials. It should be noted that the same conditions regarding concentration and thickness as described above apply.

Finally, preferred fabrication methods using ion implantation or ion beam milling have been described.

An N+ or P+ layer according to the invention can also be obtained by diffusing an impurity through a photoresist opening or passivation, for example diffusing cadmium into PbSnTe as described above.

Advantageously, the intermediate barrier that forms a barrier is advantageously made of an insulating material or a semiconductor material having a band gap that is at least three times greater than the band gap of the upper absorption semiconductor layer and at least three times greater than the band gap of the lower absorption semiconductor layer.

The invention claimed is:

1. A bispectral detector for detecting first and second electromagnetic radiation ranges, comprising:
    a stack of upper and lower semiconductor layers of a first conductivity type in order to absorb first and second electromagnetic radiation ranges respectively, separated by an intermediate layer that forms a potential barrier between the upper and lower layers;
    semiconductor zones of a second conductivity type opposite to the first conductivity type and implanted in the upper layer and in the lower layer, each semiconductor zone in the lower layer being implanted at least partially in the bottom of an opening that passes through the upper layer and intermediate layer; and
    electrical conductor elements connected respectively to semiconductor zones in order to collect the electrical charges in these zones,
    wherein at least part of each opening that passes through the upper layer is separated from said upper layer by a semiconductor cap layer of the second conductivity type,
    wherein a concentration of dopants of the second conductivity type of the semiconductor cap layer is greater than $10^{17}$ cm$^{-3}$, and
    wherein a thickness of the semiconductor cap layer is chosen as a function of said concentration so that it exceeds a minority carrier diffusion length in the semiconductor cap layer.

2. The bispectral detector as claimed in claim 1,
    wherein each semiconductor zone in the upper layer forms a volume that is contiguous with an adjacent semiconductor zone of the lower layer, and
    and wherein the intermediate layer is made of a material that is insulating with respect to the materials of the upper and lower layers or is made of a semiconductor material of the first conductivity type, whereof the band gap is more than three times that of each of the upper layer and lower layer.

3. The bispectral detector as claimed in claim 1,
    wherein the upper layer and the lower layer are made of an alloy of cadmium, mercury and tellurium that is P-doped by mercury vacancies, and
    and wherein the intermediate layer is made of an alloy of cadmium and tellurium or an alloy of cadmium, zinc and tellurium.

4. The bispectral detector as claimed in claim 1,
    wherein the upper layer and the lower layer are made of an alloy of cadmium, mercury and tellurium that is P-doped by mercury vacancies, and
    and wherein the intermediate layer is made of an alloy of cadmium, mercury and tellurium having a mercury composition that is less than half of the mercury composition of each of the upper and lower layers.

5. The bispectral detector as claimed in claim 1, wherein the part of each opening that passes through the intermediate layer is separated from the latter by a semiconductor cap layer of the second conductivity type.

6. The bispectral detector as claimed in claim 1, wherein the intermediate layer is made of a material that is insulating with respect to the material of the upper and lower layers or made of a semiconductor material of the first conductivity type, whereof the band gap is more than three times that of each of the lower and upper layers.

7. A method for manufacturing a bispectral detector for detecting first and second electromagnetic radiation ranges, comprising:
    forming a stack of upper and lower semiconductor layers of a first conductivity type in order to absorb first and second electromagnetic radiation ranges respectively, separated by an intermediate layer that forms a potential barrier between the upper layer and the lower layer;
    producing at least one opening through the upper layer and lower layer and extending as far as the lower layer;
    producing first and second sets of semiconductor zones of a second conductivity type opposite to the first conductivity type and implanted in the upper layer and the lower layer respectively, one semiconductor zone being implanted at least partially in the bottom of each opening; and
    producing electrical conductor elements connected respectively to semiconductor zones in order to collect the electrical charges in these zones,
    wherein doping of the second conductivity type by ion implantation or ion beam milling is performed on the flanks of every opening at least on that part of said flanks that is located in the upper layer,
    wherein at least part of each opening that passes through the upper layer is separated from said upper layer by a semiconductor cap layer of the second conductivity type,
    wherein a concentration of dopants of the second conductivity type of the semiconductor cap layer is greater than $10^{17}$ cm$^{-3}$, and
    wherein a thickness of the semiconductor cap layer is chosen as a function of said concentration so that it exceeds a minority carrier diffusion length in the semiconductor cap layer.

8. The method for manufacturing a bispectral detector as claimed in claim 7,
    wherein the intermediate layer is made of a material that is insulating with respect to the materials of the upper layer and the lower layer or is made of a semiconductor material of the first conductivity type, whereof the band gap is more than three times that of each of the upper layer and lower layer, and
    and wherein doping of the second conductivity type is applied to all the openings so that, in the bottom of said openings, semiconductor zones of a second conductivity type are formed in the lower layer.

9. The method for manufacturing a bispectral detector as claimed in claim 8, wherein doping of the second conductivity type on the flanks of the openings extends onto the exposed face of the upper layer, so that semiconductor zones of the second conductivity type are formed in the upper layer.

10. The method for manufacturing a bispectral detector as claimed in claim 8, wherein semiconductor zones of the second conductivity type in the upper layer are produced so that they are not in contact with the semiconductor zones of the second conductivity type obtained after doping the flanks of the openings.

11. The method for manufacturing a bispectral detector as claimed in claim 10, wherein semiconductor elements of the second conductivity type are also formed in the upper layer, especially by ion implantation or ion beam milling and these elements connect the semiconductor zones of the second conductivity type obtained after doping the flanks of the openings to a common conductor element.

12. The method for manufacturing a bispectral detector as claimed in claim 7, wherein doping of the second conductivity type on the flanks of the openings is performed by ion beam milling only for that portion of the flanks of openings contained in upper layer.

13. The method for manufacturing a bispectral detector as claimed in claim 7,
   wherein the upper layer and the lower layer are made of an alloy of cadmium, mercury and tellurium that is P-doped by mercury vacancies, and
   wherein the intermediate layer is made of an alloy of cadmium and tellurium or an alloy of cadmium, zinc and tellurium.

14. The method for manufacturing a bispectral detector as claimed in claim 7,
   wherein the upper layer and the lower layer are made of an alloy of cadmium, mercury and tellurium that is P-doped by mercury vacancies, and
   wherein the intermediate layer is made of an alloy of cadmium, mercury and tellurium having a mercury composition that is less than half of the mercury composition of each of the upper and lower layers.

\* \* \* \* \*